(12) United States Patent
Falck et al.

(10) Patent No.: US 10,211,325 B2
(45) Date of Patent: Feb. 19, 2019

(54) SEMICONDUCTOR DEVICE INCLUDING UNDULATED PROFILE OF NET DOPING IN A DRIFT ZONE

(71) Applicant: Infineon Technologies AG, Neubiberg (DE)

(72) Inventors: Elmar Falck, Hohenbrunn (DE); Andreas Haertl, Munich (DE); Manfred Pfaffenlehner, Munich (DE); Francisco Javier Santos Rodriguez, Villach (AT); Daniel Schloegl, Villach (AT); Hans-Joachim Schulze, Taufkirchen (DE); Andre Stegner, Munich (DE); Johannes Georg Laven, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 468 days.

(21) Appl. No.: 14/165,658

(22) Filed: Jan. 28, 2014

(65) Prior Publication Data

US 2015/0214347 A1    Jul. 30, 2015

(51) Int. Cl.
| | | |
|---|---|---|
| *H01L 27/06* | (2006.01) | |
| *H01L 29/739* | (2006.01) | |
| *H01L 21/265* | (2006.01) | |
| *H01L 21/324* | (2006.01) | |
| *H01L 29/06* | (2006.01) | |
| *H01L 29/66* | (2006.01) | |

(Continued)

(52) U.S. Cl.
CPC ........ *H01L 29/7395* (2013.01); *H01L 21/263* (2013.01); *H01L 21/265* (2013.01); *H01L 21/324* (2013.01); *H01L 29/0615* (2013.01); *H01L 29/0623* (2013.01); *H01L 29/36* (2013.01); *H01L 29/6609* (2013.01); *H01L 29/66128* (2013.01); *H01L 29/66333* (2013.01); *H01L 29/861* (2013.01); *H01L 29/8611* (2013.01); *H01L 29/0834* (2013.01); *H01L 29/0878* (2013.01); *H01L 29/1095* (2013.01)

(58) Field of Classification Search
CPC ............. H01L 29/7395; H01L 27/0647; H01L 27/0823; H01L 27/0825; H01L 27/0826
See application file for complete search history.

(56) References Cited

U.S. PATENT DOCUMENTS 5,292,672 A * 3/1994 Akiyama .............. H01L 21/263
257/E21.383
7,696,600 B2    4/2010 Mauder et al.
(Continued)

*Primary Examiner* — Hoai V Pham
(74) *Attorney, Agent, or Firm* — Murphy, Bilak & Homiller, PLLC

(57) ABSTRACT

A semiconductor device includes a semiconductor body having opposite first and second sides. The semiconductor device further includes a drift zone in the semiconductor body between the second side and a pn junction. A profile of net doping of the drift zone along at least 50% of a vertical extension of the drift zone between the first and second sides is undulated and includes doping peak values between $1\times10^{13}$ cm$^{-3}$ and $5\times10^{14}$ cm$^{-3}$. A device blocking voltage $V_{br}$ is defined by a breakdown voltage of the pn junction between the drift zone and a semiconductor region of opposite conductivity type that is electrically coupled to the first side of the semiconductor body.

14 Claims, 5 Drawing Sheets

(51) Int. Cl.
    *H01L 29/861*     (2006.01)
    *H01L 21/263*     (2006.01)
    *H01L 29/36*      (2006.01)
    *H01L 29/10*          (2006.01)
    *H01L 29/08*          (2006.01)

(56) References Cited

U.S. PATENT DOCUMENTS

| | | |
|---|---|---|
| 2002/0190281 A1 | 12/2002 | Francis et al. |
| 2004/0164349 A1* | 8/2004 | Nishiwaki ............ H01L 29/0696 257/330 |
| 2008/0054369 A1* | 3/2008 | Schulze ............... H01L 29/0834 257/378 |
| 2009/0283799 A1* | 11/2009 | Ruething ............ H01L 29/0834 257/143 |
| 2011/0042791 A1 | 2/2011 | Schulze et al. |
| 2011/0227128 A1* | 9/2011 | Hisamoto ........... H01L 29/0619 257/139 |
| 2011/0275202 A1* | 11/2011 | Mauder ................ H01L 21/263 438/514 |

\* cited by examiner

SEMICONDUCTOR DEVICE INCLUDING UNDULATED PROFILE OF NET DOPING IN A DRIFT ZONE

BACKGROUND

Design of semiconductor devices such as power semiconductor devices requires trade-offs between electric characteristics such as area-specific on-state resistance Ron×A, breakdown voltage Vbr between load terminals such as source and drain, switching behaviour and device ruggedness.

By way of example, increasing a specific resistance of a bulk material allows to achieve lower electric field strengths at a device front side. Although lower electric field strengths at the device front side may improve device ruggedness, a softness of the switching behaviour may be adversely affected.

It is desirable to improve the trade-off between electric characteristics in semiconductor devices.

SUMMARY

An embodiment refers to a semiconductor device comprising a semiconductor body having opposite first and second sides. The semiconductor device further comprises a drift zone in the semiconductor body between the second side and a pn junction. A profile of net doping of the drift zone along at least 50% of a vertical extension of the drift zone between the first and second sides is undulated and includes doping peak values between $1 \times 10^{13}$ cm$^{-3}$ and $5 \times 10^{14}$ cm$^{-3}$. A device blocking voltage $V_{br}$ is defined by a breakdown voltage of the pn junction between the drift zone and a semiconductor region of opposite conductivity type that is electrically coupled to the first side of the semiconductor body.

According to a method of manufacturing a semiconductor device, the method comprises forming a profile of net doping in a drift zone of a semiconductor body by multiple irradiations with protons and generating hydrogen-related donors and by annealing the semiconductor body. At least 50% of a vertical extension of the drift zone between first and second sides of the semiconductor body is undulated and includes multiple doping peak values between $1 \times 10^{13}$ cm$^{-3}$ and $5 \times 10^{14}$ cm$^{-3}$. The method further comprises forming a semiconductor region at the first side, wherein a device blocking voltage $V_{br}$ is defined by a breakdown voltage of a pn junction between the drift zone and the semiconductor region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments and intended advantages will be readily appreciated as they become better understood by reference to the following detailed description.

DETAILED DESCRIPTION

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration that is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1:
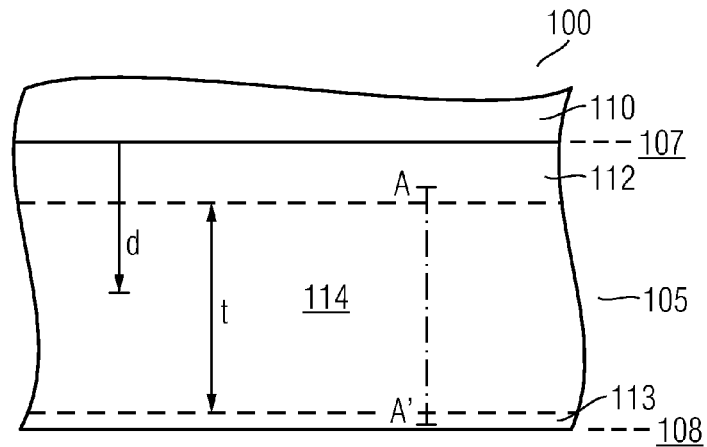
FIG. 1 is a schematic cross sectional view illustrating one embodiment of a semiconductor device.

FIG. 1 is a cross-sectional view of a part of a semiconductor device 100 including a semiconductor body 105. The semiconductor body 105 may include a semiconductor substrate, e.g. a silicon (Si) substrate, a silicon carbide (SiC) substrate or other single semiconductor or compound semiconductor substrates including one or more optional semiconductor layers thereon. First and second sides 107, 108 of the semiconductor body are opposite to each other.

A wiring area 110 is located at the first side 107 of the semiconductor body 105. The wiring area 110 includes one or a plurality of wiring levels, e.g. one or a plurality of patterned or non-patterned conductive layers including one or a combination of conductive materials such as metal(s), metal compound(s), silicide(s) and highly doped semiconductor(s). Different wiring levels or distinct parts of each wiring level, e.g. distinct conductive lines are electrically isolated by dielectric material(s), e.g. oxide(s) and/or nitride(s), diamond like carbon (DLC). Openings in the dielectric material(s) may be filled with conductive material(s) and, together with the wiring level(s), provide electric connection between different areas or device elements in the semiconductor body 105 or between device element(s) in the semiconductor body 105 and contact and/or bond pad(s).

According to one embodiment, the semiconductor device is a diode including a p-doped anode region in a first area 112 at the first side 107. The diode further includes an $n^+$-doped cathode contact region in a second area 113 at the second side 108. An optional n-doped field stop zone may be arranged in the second area 113 between the $n^+$-doped cathode contact region and the first area 112.

According to another embodiment, the semiconductor device is an insulated gate bipolar transistor (IGBT) including a p-doped body region and $n^+$-doped source region of an IGBT emitter in the first area 112 at the first side 107. The IGBT further includes a $p^+$-doped region, e.g. a so-called $p^+$-doped rear side emitter region in the second area 113 at the second side 108. An optional n-doped field stop zone may be arranged in the second area 113 between the $p^+$-doped region and the first area 112.

The semiconductor device 100 further includes an n-doped drift zone 114 between the first and second areas 112, 113. A device blocking voltage $V_{br}$ is defined by a breakdown voltage of a pn junction between the drift zone 114 and a semiconductor region of opposite conductivity type in the first area 112 that is electrically coupled to the wiring area 110 at first side 107 of the semiconductor body 105. A profile of net doping of the drift zone 114 along at least 50% or even more than 70% of a vertical extension t of the drift zone 114 between the first and second sides 107, 108 is undulated and includes several doping peak values between $1 \times 10^{13}$ cm$^{-3}$ and $5 \times 10^{14}$ cm$^{-3}$. Typically, more than three or even more than five doping peaks are realized by multiple proton irradiations.

According to an embodiment, the undulated profile of net doping in the drift zone 114 includes hydrogen-related donors. Doping with hydrogen-related donors may be effected by irradiating the semiconductor body 105 with protons, e.g. through the second side 108 and/or through the first side 107 and annealing of the semiconductor body 105. Thereby, formation of complexes comprising hydrogen atoms and the irradiation-induced defects like e.g. vacancies results in the creation of donors, i.e. so-called hydrogen-related donors in this region.

According to an embodiment, a profile of the hydrogen-related donors overlaps with a p-doping in the first area 112. According to an embodiment, the profile of the hydrogen-related donors overlaps with a p-doped anode region of a diode. According to yet another embodiment, the profile of the hydrogen-related donors overlaps with a p-doped body region of an IGBT or field effect transistor (FET). Thereby, a net doping around the pn junction between the drift zone 114 and the first area 112 may be reduced below a basic doping of the semiconductor body, e.g. below the basic doping set during wafer growth of a raw material, e.g. a semiconductor wafer such as a silicon wafer or a silicon carbide wafer. This allows to reduce a thickness of the semiconductor body 105 of the semiconductor device 100 for a given breakdown voltage, and, hence, to reduce electric losses. Furthermore, this allows to reduce an electric field strength around the pn junction at the first side 107. Thereby, the ruggedness of the semiconductor device 100 with respect to switching and/or cosmic radiation may be improved.

According to an embodiment, the undulated profile of net doping of the semiconductor device 100 includes at least two minima, or at least three minima or even at least five minima and a doping concentration of the at least two minima decreases from the second side 108 to the first side 107.

According to another embodiment of the semiconductor device 100, an averaged profile of the net doping in a depth d of the drift zone 114 with respect to the first side 107 is a net doping value averaged in a depth range d±0.1*t, t being a vertical extension of the drift zone between the first and second sides, and the averaged profile of net doping increases with respect to at least 20%, or even more than 30% or even more than 50% or even more than 70% of the vertical extension t of the drift zone 114 from the first side 107 to the second side 108.

The above profiles of net doping may be formed by multiple irradiations with protons at different energies and/or doses and/or annealing processes. According to an embodiment, the annealing is carried out in a temperature range of 300° C. and 500° C. for a duration between one to four hours. According to another embodiment, the annealing is carried out in a temperature range of 350° C. and 430° C. for a duration between one to four hours.

The above profiles of net doping in the drift zone 114 include a rather low doping concentration around the pn junction between the drift zone 114 and the first area 112 and the average profile increases from a doping concentration around or below the basic doping of the semiconductor body at the pn junction through the drift zone 114 towards a higher average doping concentration of an optional field stop zone in the second area 113. An undulation of the net doping profile may be adjusted by appropriately choosing proton irradiation parameters such as number, energy, and/or dose of proton irradiation, e.g. proton implantation and annealing parameters such as annealing temperature and annealing duration.

In a vertical range between a center of the drift zone 114 and an end of the drift zone 114 with respect to the second side 108, the net doping profile according to the above embodiments serves as an area for reduction of the electric field strength, e.g. as a field stop region, thereby improving the softness of the switching behavior. In a vertical range of the drift zone 114 close to the pn junction between the drift zone 114 and the first area 112, the net doping profile according to the above embodiments serves as an effective measure for reducing the net doping below the basic doping of the semiconductor body 105, which allows for a local reduction of the electric field strength. The local reduction of the electric field strength close to the pn junction between the drift zone 114 and the first area 112 allows to improve the ruggedness of the semiconductor device 100 and to reduce a thickness of the semiconductor device 100 resulting in a reduction of electric losses.

Figure 2:
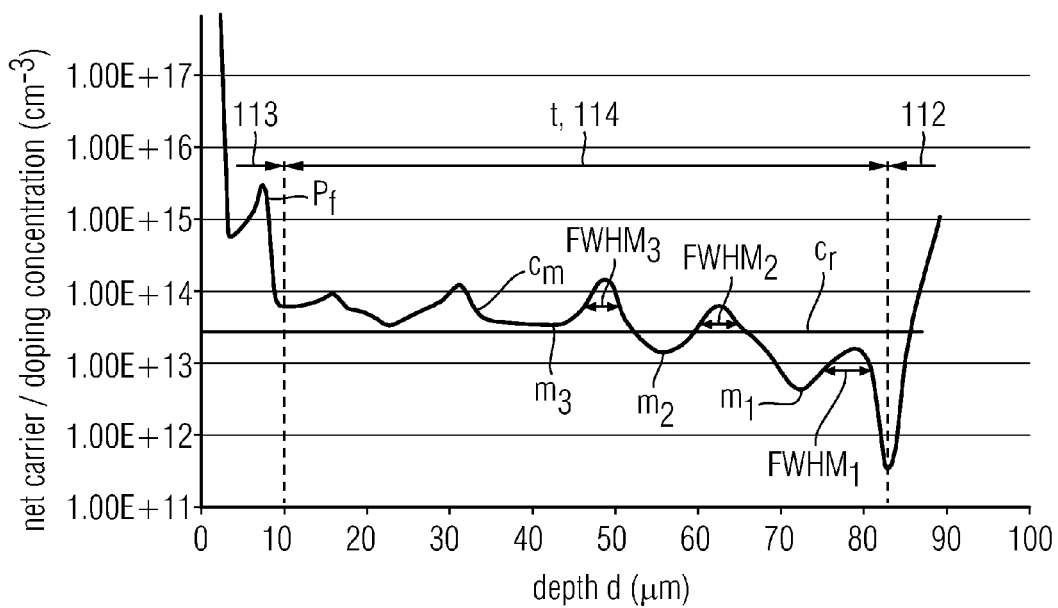
FIG. 2 is a graph illustrating one embodiment of a net doping profile of the semiconductor device of FIG. 1.

FIG. 2 is a graph illustrating a net doping/carrier concentration $c_m$ versus a vertical extension along a depth d of a semiconductor diode. The illustrated net doping profile is one embodiment of a net doping profile along a line A-A' of the semiconductor device 100 illustrated in FIG. 1.

The illustrated net doping profile has been measured by spreading resistance profiling (SRP), also known as spreading resistance analysis (SRA), which is a technique used to analyze resistivity versus depth in semiconductors. The basic doping of the semiconductor body of the semiconductor diode, i.e. the basic doping of the raw material used to fabricate the semiconductor diode is indicated in the graph as a horizontal line denoted as $c_r$.

The semiconductor diode includes a field stop zone in the second area 113 between the drift zone 114 and the second side 108 located in the depth range between approximately 3 µm and 10 µm. The field stop zone includes a doping peak profile $p_f$ decreasing to the first and second sides 107, 108. The doping peak profile $p_f$ may result from hydrogen-related donors formed by proton irradiation and annealing, for example.

An $n^+$-doped cathode contact region is located between the field stop zone and the second side 108. The $n^+$-doped cathode contact region includes the part of the illustrated net doping profile in the depth range between approximately 0 µm and 3 µm.

A p-doped anode region is located in the first area 112 in the depth range starting from approximately 82 µm. The p-doped anode region may be formed by introducing p-type dopants, e.g. one or any combination of boron (B), indium (In), aluminum (Al), gallium (Ga), for example. The p-type dopants may be introduced by ion implantation and/or a diffusion process, for example.

According to the illustrated embodiment, the profile of net doping $c_m$ in the drift zone 114 is undulated along at least 50% of the vertical extension t of the drift zone 114 between the first and second sides 107, 108 and includes doping peak values between $1 \times 10^{13}$ cm$^{-3}$ and $5 \times 10^{14}$ cm$^{-3}$. The drift zone 114 is located between approximately 10 µm and 83 µm.

The dimensions described with respect to FIG. 2 are merely examples and may differ in other embodiments.

According to the illustrated embodiment, the profile of net doping $c_m$ includes at least two minima, and a doping concentration of the at least two minima decreases from the second side to the first side, cf. illustrated minima denoted $m_1$, $m_2$, $m_3$.

According to the illustrated embodiment, a full width at half maximum (FWHM) of net doping peaks of the drift zone 114 increases from the second side 108 to the first side 107, cf. illustrated full widths at half maximum denoted $FWHM_1$, $FWHM_2$, $FWHM_3$. The net doping profile according to the illustrated embodiment may be formed by irradiating the semiconductor body 105 from the second side 108. The irradiation or implantation energy of the protons related to the $FWHM_1$ is larger than the irradiation or implantation energy of the protons related to the $FWHM_2$, $FWHM_3$. Likewise, the irradiation or implantation energy of the protons related to the $FWHM_2$ is larger than the irradiation or implantation energy of the protons related to the $FWHM_3$. Since larger irradiation energies result in an increased width of the so-called end-of-range peak, the different implantation energies result in the illustrated profiles denoted $FWHM_1$, $FWHM_2$, $FWHM_3$.

In the embodiment illustrated in FIG. 2, the net doping profile in the depth range between approximately 10 µm and 50 µm is beneficial with respect to soft switching behavior, whereas the net doping profile in the depth range between approximately 52 µm and 58 µm as well as between 65 µm and 80 µm has concentration values smaller than a basic doping of the raw material, e.g. due to compensation doping caused by crystal damage due to irradiation. The basic doping may be defined by dopants of the raw material before undergoing front-end processing, e.g. by group V impurities such as phosphorus (P), arsenic (As), antimony (Sb) in an n-doped raw material. As an example of doping the raw material manufactured by Czochralski (CZ) growth, dopants may be introduced into a silicon melt from where a silicon ingot is pulled. Lowering of the net doping below the basic doping of the raw material allows for a local reduction of the electric field strength close to the pn junction between the drift zone 114 and the first area 112, and thus allows to improve the ruggedness of the semiconductor device 100 and to reduce a thickness of the semiconductor device 100 resulting in a reduction of electric losses.

The net doping profiles according to the embodiments allow for an improved trade-off between electric characteristics.

Figure 3:
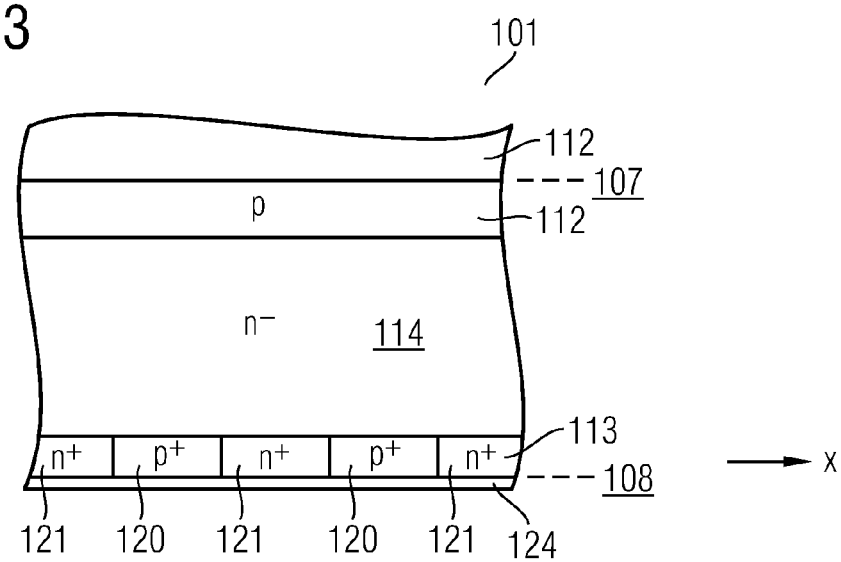
FIG. 3 is a schematic cross sectional view illustrating one embodiment of a semiconductor device including p$^+$-doped injection regions.

FIG. 3 is a cross-sectional view of a part of a semiconductor diode 101 according to an embodiment. The semiconductor diode includes a p-doped anode region in the first area 112. The semiconductor diode 101 includes the drift zone 114 as described in detail with respect to the embodiment illustrated in FIG. 1.

According to the embodiment illustrated in FIG. 3, the semiconductor diode 101 further comprises $p^+$-doped and $n^+$-doped areas 120, 121 alternatingly arranged along a lateral direction×parallel to the second side and electrically connected to an electrode 124 at the second side.

The $n^+$-doped areas 121 of the semiconductor diode 101 constitute cathode contact regions.

The $p^+$-doped areas 120 of the semiconductor diode 101 constitute so called p-short regions configured to inject holes from the second side 108 during switching operations of the semiconductor diode 101. A penetration depth of the $p^+$-doped areas 120 may be approximately the same as the penetration depths of the $n^+$-doped areas 121 or alternatively may be smaller, which means that they are embedded in the $n^+$-doped areas 121.

Figure 4A:
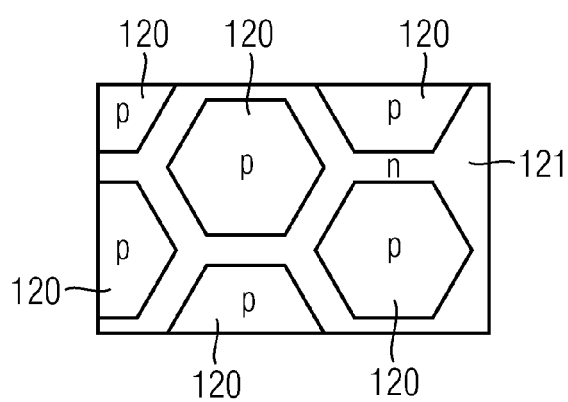
FIGS. 4A to 4D are schematic top views illustrating different layouts of the p$^+$-doped injection regions of FIG. 3.
Figure 4B:
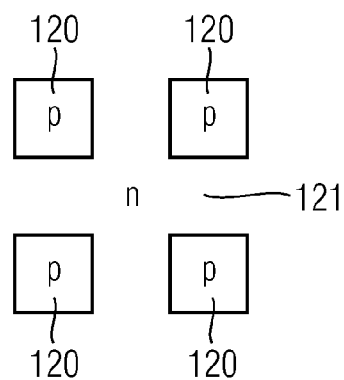
Figure 4C:
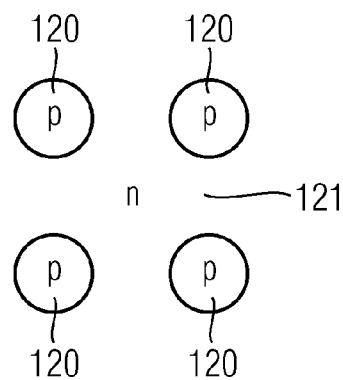
Figure 4D:
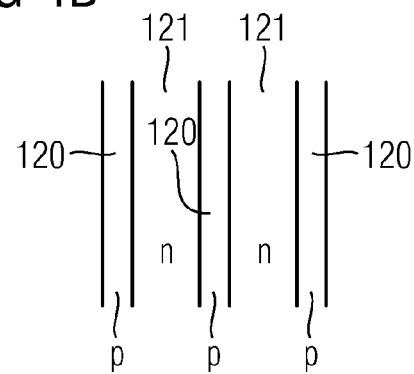

The $p^+$-doped areas 120 may be arranged in a vast variety of ways with respect to the $n^+$-doped areas 121. Typical designs are illustrated as top views in FIGS. 4A to 4D and include, inter alia, polygonal $p^+$-doped areas 120 (FIG. 4A), square $p^+$-doped areas 120 (FIG. 4B), circular $p^+$-doped areas 120 (FIG. 4C), and stripe-shaped $p^+$-doped areas 120 (FIG. 4D). Other typical designs include elliptic $p^+$-doped areas 120, triangular $p^+$-doped areas 120, crosswise00000, $p^+$-doped areas 120 and any combination of the above shapes.

The semiconductor diode of the embodiments illustrated in FIGS. 3 to 4D allows for a soft switching behavior in combination with reduced switching losses. By adjusting the net doping profile in the drift zone 114 a dynamic of electric field buildup during a turn-off period as well as a hole injection by the $p^+$-doped areas 120 may be appropriately set to achieve a soft switching nearly independent of current, voltage and switching speed. Furthermore, hole injection by the $p^+$-doped areas 120 at undesirable times during switching may be reduced leading to a combined improvement of the switching behavior and electric losses. The p+-doped areas 120 also improve a breakdown voltage stability of semiconductor diodes.

Figure 5A:
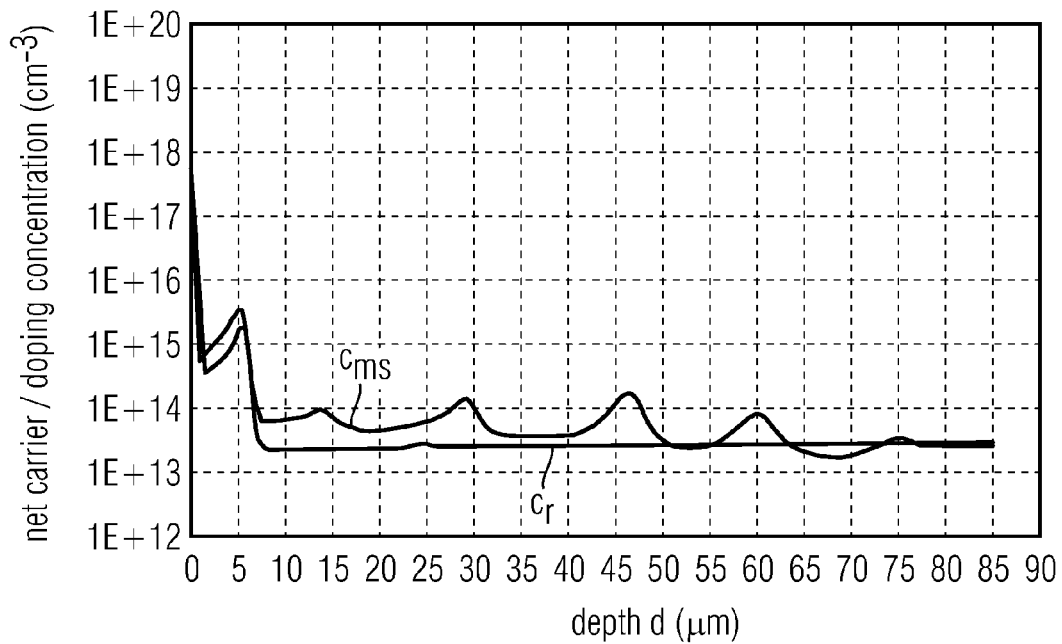
FIG. 5A is a graph illustrating one embodiment of a net doping profile of the semiconductor device of FIG. 3 and a reference device.

FIG. 5A is a graph illustrating a net doping/carrier concentration $c_{ms}$ versus a vertical extension along a depth d of a semiconductor diode according to an embodiment. The illustrated net doping profile $c_{ms}$ is another embodiment of a net doping profile along a line A-A' of the semiconductor device 100 illustrated in FIG. 1.

The net doping profile $c_{ms}$ is associated with the semiconductor diode including an undulated net doping profile in the drift zone 114 with doping peak values between $1\times10^{13}$ cm$^{-3}$ and $5\times10^{14}$ cm$^{-3}$. Furthermore, the semiconductor diode includes p+-doped and n+-doped areas 120, 121 alternatingly arranged along a lateral direction×parallel to the second side and electrically connected to the electrode 124 at the second side, cf. FIG. 3.

A reference semiconductor diode includes a net doping profile $c_r$ that differs from the net doping profile $c_{ms}$ with respect to the profile in the drift zone 114. The net doping profile $c_r$ of the reference semiconductor diode is almost constant in the drift zone 114. Similar to the semiconductor diode including the net doping profile $c_{ms}$, the reference semiconductor also includes p+-doped and n+-doped areas 120, 121 alternatingly arranged along a lateral direction× parallel to the second side.

Similar to the graph illustrated in FIG. 2, the net doping profiles $c_{ms}$, $c_r$ have been measured by spreading resistance profiling (SRP), also known as spreading resistance analysis (SRA).

Figure 5B:
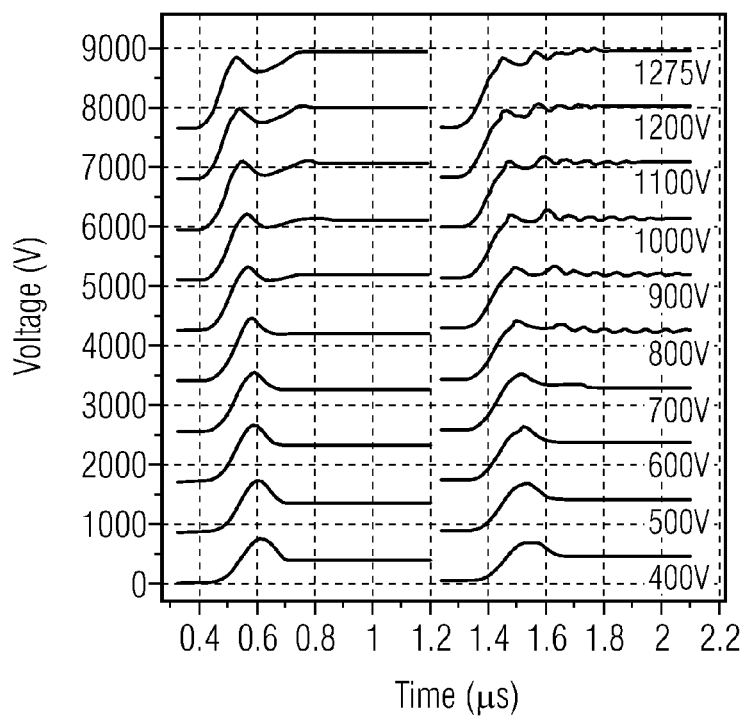
FIGS. 5B and 5C are graphs illustrating electric characteristics of the semiconductor devices with net doping profiles as illustrated in FIG. 5A.

FIG. 5B is a graph illustrating a timing of a diode voltage during diode commutation of the semiconductor diode including the net doping profile $c_{ms}$ of FIG. 5A (left part of graph of FIG. 5B) and the reference semiconductor diode including the net doping profile $c_r$ of FIG. 5A (right part of graph of FIG. 5B) for different intermediate circuit voltages. The semiconductor diode including the net doping profile $c_{ms}$ is superior to the reference semiconductor diode including the net doping profile $c_r$ with respect to undesirable voltage overshoots.

Figure 5C:
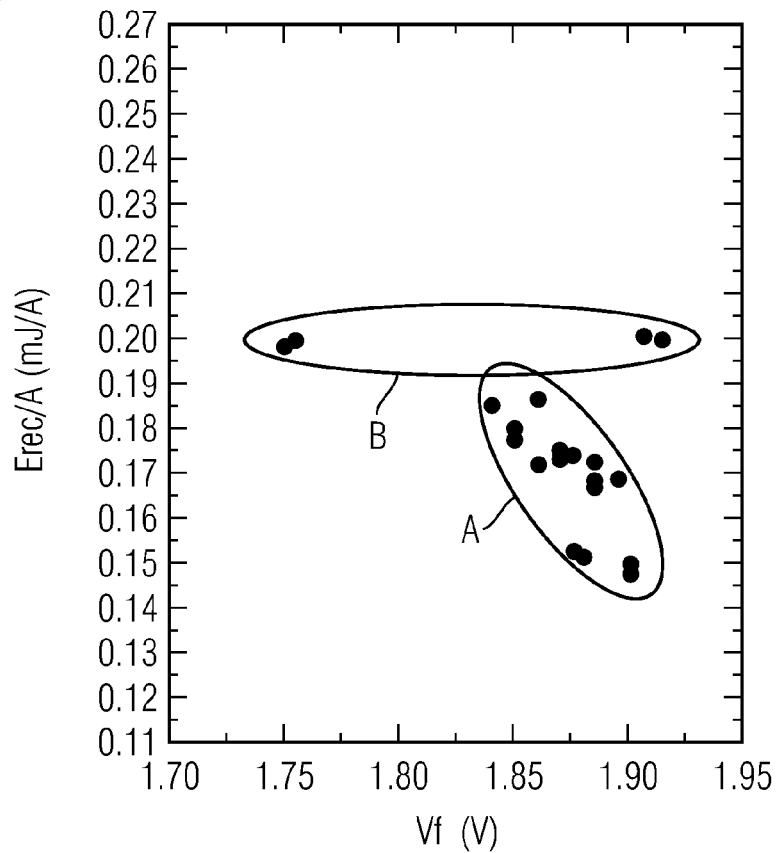

FIG. 5C is a graph illustrating a trade-off between losses in switching and conducting mode for semiconductor diodes including a net doping profile similar to $c_{ms}$ of FIG. 5A (group denoted A) and reference semiconductor diodes including a net doping profile similar to the net doping profile $c_r$ of FIG. 5A (group denoted B). The graph illustrates a switching loss identified by a reverse recovery energy normalized by the current $E_{rec}/A$ (versus a forward voltage Vf at a reference current. The semiconductor diodes including the net doping profile similar to $c_{ms}$ provide the benefit of smaller switching losses compared with the reference semiconductor diodes including a net doping profile similar to $c_r$.

Figure 6A:
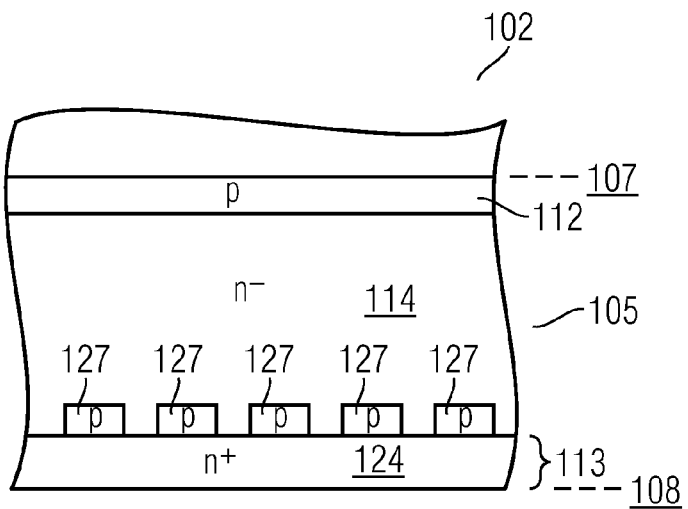
FIGS. 6A and 6B are schematic cross sectional views illustrating embodiments of semiconductor diodes including buried p$^+$-doped regions.
Figure 6B:
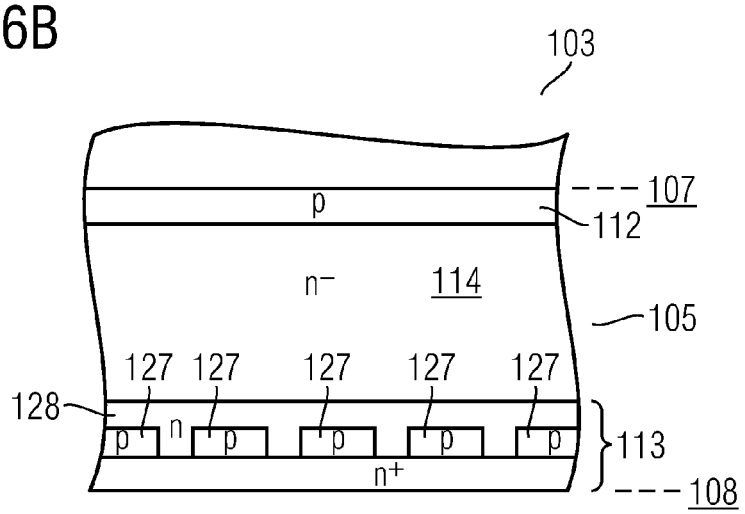

FIGS. 6A, 6B are cross-sectional views of a part of semiconductor diodes 102, 103 according to other embodiments. The semiconductor diodes 102, 103 are similar to the semiconductor device 100 illustrated in FIG. 1 and further comprise p-doped regions 127 buried in the semiconductor body 105 at the second side 108 and embedded in n-doped semiconductor material of the semiconductor body 105.

With respect to the semiconductor diode 102 illustrated in FIG. 6A, the p-doped regions 127 are surrounded by n−-doped semiconductor material of the drift zone 114 and the cathode contact region 124. With respect to the semiconductor diode 102 illustrated in FIG. 6A, the p-doped regions 127 are surrounded by n-doped semiconductor materials of the drift zone 114 and the cathode contact region 124, respectively. With respect to the semiconductor diode 103 illustrated in FIG. 6B, the p-doped regions 127 are surrounded by n-doped semiconductor materials of a field stop zone 128 and the cathode contact region 124, respectively.

The p-doped regions 127 are beneficial with respect to stabilizing dynamic avalanche during switching.

The p-doped regions 127 may also be applied to the an IGBT having a basic structure as illustrated in FIG. 1. In this case, the p-doped regions 127 may be surrounded by an n-doped field stop zone, for example.

Figure 7:
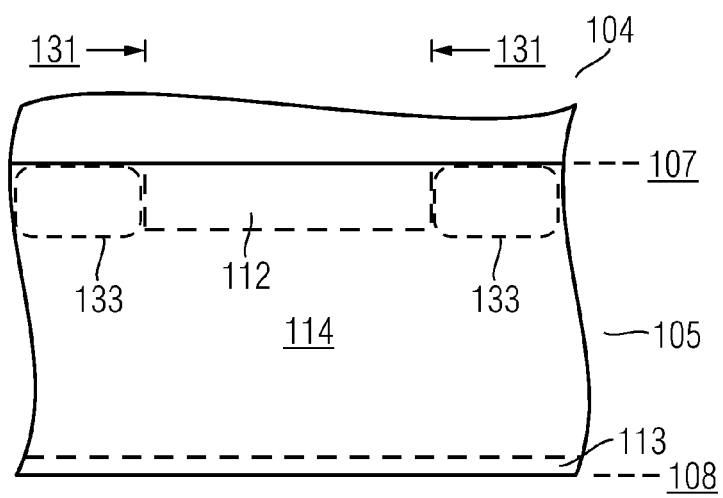
FIG. 7 is a schematic cross sectional view illustrating a semiconductor device including hydrogen-related donors in a junction termination area.

According to another embodiment illustrated in FIG. 7, a semiconductor device 104 includes the first and second areas 112, 114 similar to the semiconductor device 100 illustrated in FIG. 1. Further, the semiconductor device 104 includes, apart from an undulated net doping profile in the drift zone 114, hydrogen-related donors in addition to the basic doping of the raw material of the semiconductor body 105 in a portion 133 of a junction termination area 131 between the pn junction and the first side 107. The hydrogen-related donors may improve a reliability of the junction termination.

Figure 8:
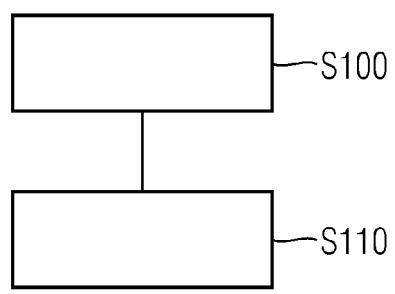
FIG. 8 is a simplified chart illustrating process features of a method of manufacturing a semiconductor device.

FIG. 8 is a simplified chart illustrating process features of a method of manufacturing a semiconductor device.

Process feature 5100 includes forming a profile of net doping in a drift zone of a semiconductor body by multiple irradiations with protons and generating hydrogen-related donors by annealing the semiconductor body, wherein at least 50% of a vertical extension of the drift zone between first and second sides of the semiconductor body is undulated and includes multiple doping peak values between $1\times10^{13}$ cm$^{-3}$ and $5\times10^{14}$ cm$^{-3}$. Typically, at least two or more than three or even more than five doping peaks are realized multiple proton irradiations, e.g. at least two or more than three or even more than five proton irradiations.

Process feature S110 includes forming a semiconductor region at the first side, wherein a device blocking voltage $V_{br}$ is defined by a breakdown voltage of a pn junction between the drift zone and the semiconductor region.

According to an embodiment, the annealing is carried out in a temperature range of 300° C. and 500° C. for a duration between one to four hours. According to another embodiment, the annealing is carried out in a temperature range of 350° C. and 430° C. for a duration between one to four hours.

In another embodiment, the irradiation with protons is carried out from the second side.

Yet another embodiment further comprises forming distinct p+-doped regions at the second sides, and forming a continuous n+-region laterally surrounding the distinct p+-doped regions at the second side.

Another embodiment further comprises forming p-doped regions buried in the semiconductor body at the second side and embedded in n-doped semiconductor material of the semiconductor body.

According to another embodiment, the annealing is carried out at different temperatures with respect to at least some of the proton irradiations. Annealing at lower temperatures, e.g. around 350° C. or below allows to form regions acting as doped regions and recombination regions.

Although specific embodiments have been illustrated and described herein, it will be appreciated by those of ordinary skill in the art that a variety of alternate and/or equivalent implementations may be substituted for the specific embodiments shown and described without departing from the scope of the present invention. By way of example, the semiconductor regions denoted p-doped or n-doped in the illustrated embodiments may also be doped vice versa, i.e. the semiconductor regions denoted p-doped may be n-doped and the semiconductor regions denoted n-doped may be p-doped. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor body having opposite first and second sides; and
a drift zone in the semiconductor body between the second side and a pn junction,
wherein the drift zone extends from the pn junction to a field stop zone having a smallest vertical distance to the first side with respect to any field stop zone in the semiconductor body;
wherein a profile of net doping of the drift zone along at least 50% of a vertical extension of the drift zone from the pn junction to the field stop zone is undulated and includes multiple doping peak values between $1\times10^{13}$ cm$^{-3}$ and $5\times10^{14}$ cm$^{-3}$,
wherein a device blocking voltage $V_{br}$ is defined by a breakdown voltage of a pn junction between the drift zone and a semiconductor region of opposite conductivity type that is electrically coupled to the first side of the semiconductor body.

2. The semiconductor device of claim 1, wherein the undulated profile of net doping includes hydrogen-related donors.

3. The semiconductor device of claim 1, wherein the undulated profile of net doping includes at least two minima, and a doping concentration of the at least two minima decreases from the second side to the first side.

4. The semiconductor device of claim 1, wherein the undulated profile of net doping includes at least three minima, and a doping concentration of the at least three minima decreases from the second side to the first side.

5. The semiconductor device of claim 1, wherein the field stop zone adjoins an n$^+$-doped contact region, and the field stop zone includes a doping peak profile decreasing to the first and second sides, respectively.

6. The semiconductor device of claim 1, wherein the profile of net doping of the drift zone includes at least one peak in a depth range $0.45*\Delta<d<0.55*\Delta$, d being a vertical distance with respect to the first side of the semiconductor body and $\Delta$ being a thickness of the semiconductor body between the first and second sides.

7. The semiconductor device of claim 1, wherein a full width at half maximum of net doping peaks of the drift zone increases from the second side to the first side.

8. The semiconductor device of claim 1, further comprising, in a junction termination area, hydrogen-related donors between the pn junction and the first side.

9. The semiconductor device of claim 1, further comprising p$^+$-doped and n$^+$-doped areas alternatingly arranged along a lateral direction parallel to the second side and electrically connected to an electrode at the second side.

10. The semiconductor device of claim 9, wherein the p$^+$-areas are distinct p$^+$-regions laterally surrounded by a continuous n$^+$-region including the n$^+$-areas.

11. The semiconductor device of claim 1, further comprising p-doped regions buried in the semiconductor body at the second side and embedded in n-doped semiconductor material of the semiconductor body.

12. The semiconductor device of claim 1, wherein the semiconductor device is a diode and the semiconductor region is an anode region.

13. The semiconductor device of claim 1, wherein the semiconductor device is an insulated gate bipolar transistor and the semiconductor region is a body region electrically coupled to an emitter terminal of the insulated gate bipolar transistor.

14. The semiconductor device of claim 1, wherein a net doping concentration of a part of the drift zone is smaller than a doping concentration of a raw material of the semiconductor body.

* * * * *